United States Patent
Ide et al.

(10) Patent No.: US 7,106,976 B2
(45) Date of Patent: Sep. 12, 2006

(54) OPTICAL TRANSMITTER

(75) Inventors: Tsugio Ide, Nagato-machi (JP); Shojiro Kitamura, Fujimi-machi (JP); Teruyasu Hama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 601 days.

(21) Appl. No.: 10/207,966

(22) Filed: Jul. 31, 2002

(65) Prior Publication Data

US 2003/0035186 A1 Feb. 20, 2003

(30) Foreign Application Priority Data

Aug. 9, 2001 (JP) ............................. 2001-242810

(51) Int. Cl.
*H04B 10/04* (2006.01)

(52) U.S. Cl. ...................... 398/182; 398/183; 398/186; 398/190; 398/191; 398/197; 372/32; 372/34; 372/36; 372/38; 372/29

(58) Field of Classification Search ............... 398/116, 398/182, 183, 186, 190, 191, 197; 372/38.02, 372/34, 36, 38, 32, 29; 358/468; 369/116
See application file for complete search history.

(56) References Cited

U.S. PATENT DOCUMENTS 5,040,242 A * 8/1991 Tsuchiya et al. ............ 398/116
5,444,728 A * 8/1995 Thompson ................ 372/38.02
5,574,574 A * 11/1996 Kawamura .................. 358/468
6,011,768 A * 1/2000 Taguchi ...................... 369/116
6,711,190 B1 * 3/2004 Schemmann et al. ..... 372/38.02

FOREIGN PATENT DOCUMENTS

| JP | A-06-164497 | 6/1994 |
|---|---|---|
| JP | A-9-270749 | 10/1997 |
| JP | A-10-13340 | 1/1998 |
| JP | A-11-288335 | 10/1999 |
| JP | A-2000-138415 | 5/2000 |
| JP | A-2000-152026 | 5/2000 |
| JP | A-2000-152225 | 5/2000 |
| JP | A-2000-221933 | 8/2000 |
| JP | A-2001-195341 | 7/2001 |
| KR | A 10-2001-38333 | 5/2001 |

* cited by examiner

*Primary Examiner*—Hanh Phan
(74) *Attorney, Agent, or Firm*—Oliff & Berridge, PLC

(57) ABSTRACT

This invention provides an optical transmitter in which reduced power consumption is achieved by, when a signal generator needs data transmission, driving a laser emitting device to perform emission. An optical transmitter includes a receiver, a laser driving circuit, a light emitting unit constituted by a plurality of laser emitting devices, and an EDID memory. The receiver and the laser driving circuit are supplied with power from a dedicated external power supply through a power-supply line, and the power-supply line is provided with a switch. The contact of the switch is controlled to open and close based on a power-supply voltage supplied from the DDC controller to the EDID memory.

5 Claims, 3 Drawing Sheets

OPTICAL TRANSMITTER

BACKGROUND OF THE INVENTION

1. Field of Invention

The present invention relates to an optical transmitter having a function in which, when electric signals, such as picture data from a signal generator, such as a computer, are transmitted to a display unit by using an optical cable, the electric signals are converted into optical signals.

2. Description of Related Art

In the related art, this type of optical transmitter includes laser diodes as laser emitting devices and a laser driving circuit to drive the laser diodes. It is common for the laser driving circuit to use a method in which input data is superimposed as pulse-modulated signals on a direct-current bias current, as described in, for example, Japanese Unexamined Patent Application Publication No. 2000-138415.

This type of optical transmitter can also use a power supply separately from a signal generator, as described in Japanese Unexamined Patent Application Publication No. 9-270749.

SUMMARY OF THE INVENTION

As described above, by applying power, which is separate from that for a signal generator, to an optical transmitter of the related art, power is supplied to a laser driving circuit, etc., of the optical transmitter.

In this state in which the power is applied, the laser driving circuit is supplied with power and has a constantly flowing bias current, thus causing a problem in that the bias current causes a laser diode to perform emission, even when no data (electric signal) is input from the signal generator to the laser driving circuit.

In other words, even when the signal generator does not perform data transmission (non-operating mode), the optical transmitter is subject to constant power consumption. It is preferable to reduce this power consumption since it is useless.

The present invention addresses this matter and provides an optical transmitter in which reduced power consumption is achieved by driving a laser emitting device to perform emission when a signal generator needs data transmission.

To address or solve the above problem, various aspects of the invention are described below.

Specifically, a first aspect of the invention is an optical transmitter including at least a laser driving circuit which receives an electric signal from a signal generator, which, based on the electric signal, drives laser emitting devices, and using, as a power supply for the laser driving circuit, a dedicated power supply that is different from a power supply for the signal generator. Between the dedicated power supply and the laser driving circuit, a switch to switch the electric connection between the dedicated power supply and the laser driving circuit is provided, and the switching of the switch is performed based on a predetermined control signal from the signal generator.

A second aspect of the invention is an optical transmitter as set forth in the first aspect, further including a storage device which stores beforehand display information on a display unit to display picture data from the signal generator, and from which the display information is read in response to a request from a controller for the signal generator. A power supply for the storage device is shared as a power supply for the controller, and the switching by the switch is performed based on any one of the power-supply voltage of the storage device, and a clock or data from the controller.

In the inventions set forth in the first and second aspects which have the above constructions, when the signal generator needs to transmit data, the switch is turned on, whereby power is supplied from the dedicated power supply to the laser driving circuit, etc. In addition, when data transmission is not necessary, the switch is turned off, whereby the power supply is stopped. Accordingly, only when the signal generator needs to transmit the data does it enable driving of the laser emitting devices. Thus, reduced power consumption can be achieved.

A third aspect of the invention is an optical transmitter including at least a laser driving circuit to receive an electric signal from a signal generator and, based on the electric signal, drives laser emitting devices. The optical transmitter includes a storage device which stores beforehand display information on a display unit to display picture data from the signal generator, and from which the display information is read in response to a request from a controller for the signal generator, and a power supply for the laser driving circuit and the storage device is shared as a power supply for the controller.

In the invention set forth in the third aspect which has the above construction, when the signal generator needs to transmit data, power is supplied from the power supply for the signal generator to the laser emitting devices, etc. In addition, when data transmission is not necessary, the power supply is stopped. Accordingly, only when the signal generator needs to transmit the data does it enable driving of the laser emitting devices. Thus, reduced power consumption can be achieved.

A fourth aspect of the invention is an optical transmitter including at least a laser driving circuit to receive an electric signal from a signal generator and, based on the electric signal, drives laser emitting devices, and uses, as a power supply for the laser driving circuit, a dedicated power supply that is different from a power supply for the signal generator. Based on an external enable signal, the laser driving circuit controls the light-emitting operation or the non-light-emitting operation of the laser emitting devices, and a predetermined control signal from the signal generator is used as the enable signal.

A fifth aspect of the invention is an optical transmitter as set forth in the fourth aspect, further including a storage device which stores beforehand display information on a display unit to display picture data from the signal generator, and from which the display information is read in response to a request from a controller for the signal generator. A power supply for the storage device is set to be shared as a power supply for the controller, and the enable signal is set based on any one of the power-supply voltage of the storage device, and a clock or data from the controller.

In the inventions set forth in the fourth and fifth aspects which have the above constructions, when the signal generator needs to transmit data, the laser driving circuit can control the laser emitting devices to perform a light emitting operation. In addition, when data transmission is unnecessary, the laser driving circuit sets the laser emitting devices to have a non-light-emitting operation, so that the supply of a bias current is stopped. Accordingly, only when the signal generator needs to transmit the data does it enable driving of the laser emitting devices. Thus, reduced power consumption can be achieved.

DETAILED DESCRIPTION OF PREFERRED EMBODIMENTS

The construction of a first embodiment of an optical transmitter is described below with reference to FIG. 1.

When a computer 2 as a signal generator needs to transmit picture data to a display unit (not shown), an optical transmitter 1 according to the first embodiment receives and converts electric signals corresponding to the picture data into optical signals and transmits the optical signals to an optical receiver (not shown) and a display unit through an optical cable 3, whereby reduction in power consumption can be achieved.

Figure 1:
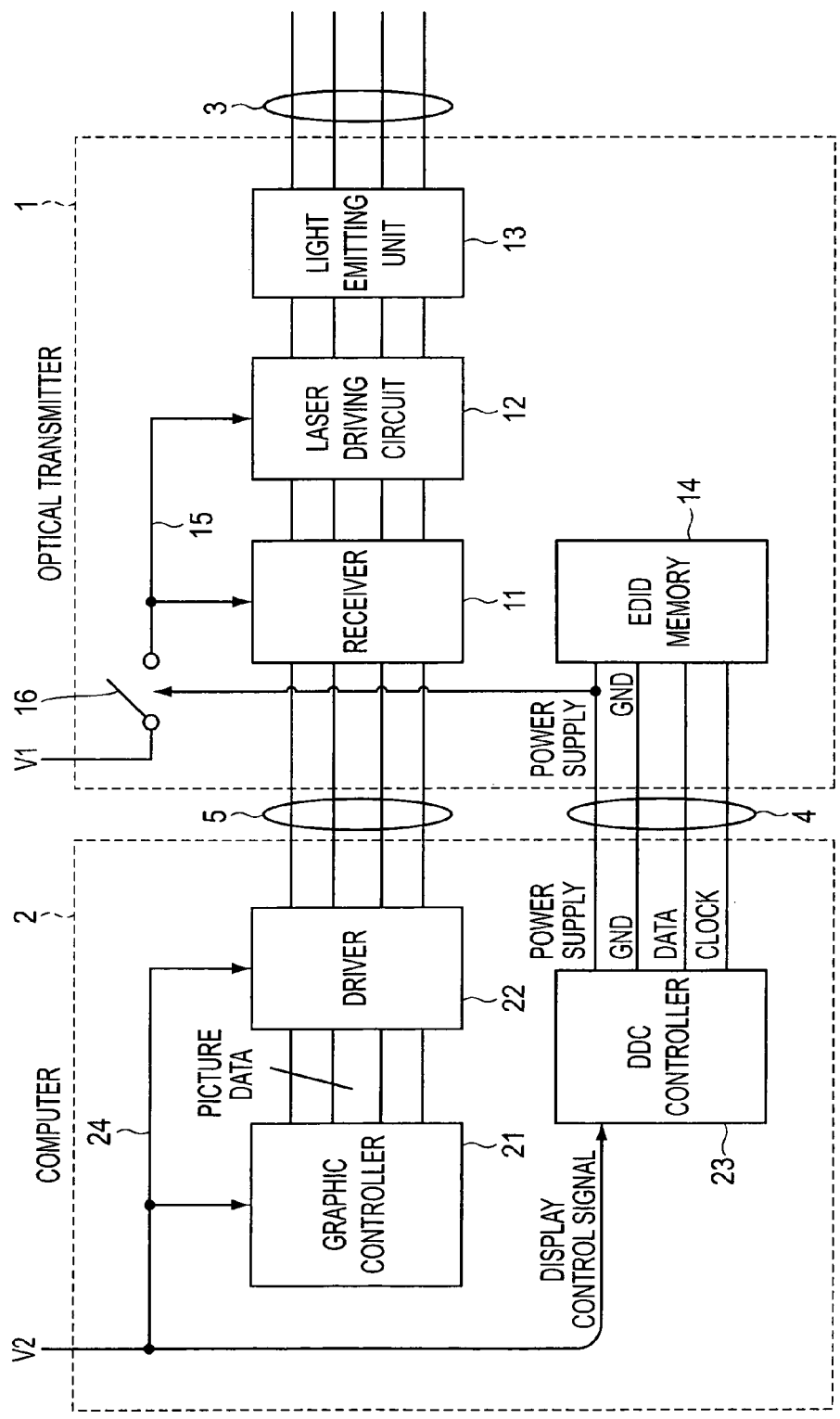
FIG. 1 is a schematic showing the structure of an optical transmitter according to a first embodiment of the present invention.

Accordingly, as shown in FIG. 1, the optical transmitter 1 includes a receiver 11, a laser driving circuit 12, a light emitting unit 13 constituted by a plurality of laser-emitting devices (e.g., laser diodes, etc.), and an EDID memory 14. Power is supplied from a dedicated external power supply V1 to the receiver 11 and the laser driving circuit 12 through a power-supply line 15, and a switch 16 is provided on the power-supply line 15.

The contact of the switch 16 is controlled to open and close based on a power-supply voltage supplied from a DDC controller 23 in the computer 2 to the EDID memory 14.

The above description is an outline of the structure of the optical transmitter 1. Prior to a detailed description of the structure of the optical transmitter, details of the structure of the computer 2 connected to the optical transmitter 1 are described.

As shown in FIG. 1, the computer 2 includes at least a graphic controller 21, a driver 22, the DDC controller 23, and these units are supplied with power from a computer-use external power supply V2 through a power-supply line 24.

The graphic controller 21 outputs, in parallel, to the driver 22, 8-bit RGB picture data which is generated by the computer 2 and is stored in a memory (not shown), and outputs display control signals (a vertical synchronizing signal, a horizontal synchronizing signal, etc.) to the driver 22.

The driver 22 converts the parallel RGB display data output from the graphic controller 21 into series picture data, and transmits, to the receiver 11 in the optical transmitter 1, the picture data obtained by the conversion and the display control signals from the graphic controller 21. The driver 22 and the receiver 11 are electrically connected by a transmission cable 5.

Before transmitting the picture data from the computer 2 to the optical transmitter 1, the DDC controller 23 reads and acquires display information (EDID: Extended Display Identification Data) which is stored in the EDID memory 14 in the optical transmitter 1. This type of communication is referred to as DDC (Display Data Channel) communication. The DDC controller and the EDID memory 14 are electrically connected to each other by a transmission cable 4.

Here, the picture data from the computer 2 is transmitted to the display unit (not shown) through the optical transmitter 1 and is displayed on the display unit. Display information on the display unit is necessary in order for the displayed data to be appropriate. Accordingly, as described above, the display information is stored in the EDID memory 14 beforehand.

The display information includes the name of a manufacturer of the display unit, a production code, a serial number, vertical and horizontal screen sizes, processible picture timing, a resolution, and an inputable synchronizing signal frequency.

Next, the detailed structure of the units of the optical transmitter 1 is described with reference to FIG. 1.

The receiver 11 receives the series RGB picture data and the display control signals sent from the driver 22 in the computer 2, and outputs them to the laser driving circuit 12.

The laser driving circuit 12 is a circuit that drives each of the laser emitting devices of the light emitting unit 13 to perform emission in response to the picture data and display control signals received by the receiver 11. The specific structure of the laser driving circuit 12 uses a method to superimpose input data as a pulse modulated signal on a direct-current bias current, as described in, for example, Japanese Unexamined Patent Application Publication No. 2000-138415.

The light emitting unit 13 includes a plurality of (in this embodiment, four) laser emitting devices (e.g., laser diodes), which are not shown, and each laser emitting device is controlled by the laser driving circuit 12 to generate each optical signal in response to each piece of the picture data, etc.

The optical signals are transmitted to an optical receiver (not shown) through an optical cable 3 formed of optical fibers, and are photoelectrically converted into the original picture data or the like. The picture data is transmitted and displayed on the display unit.

The EDID memory 14 is a data writable memory in which the display information (EDID) on the display unit is stored beforehand.

From the EDID memory 14, the display information is read in response to a request of the DDC controller 23, and the read displayed information is transmitted to the DDC controller 23 through the cable 4.

A power supply for the EDID memory 14 is shared as a power supply for the DDC controller 23 in the computer 2. Accordingly, the power supply for the EDID memory 14 and the power supply for the DDC controller 23 are electrically connected to each other by a power-supply line as part of the transmission cable 4.

For example, an electronic switch including a MOS transistor, or a mechanical switch in which its mechanical contact is opened and closed by passing a current in an exciting coil, etc., can be used as the switch 16.

The contact of the switch 16 is controlled to open and close in response to the level of a power-supply voltage supplied from the DDC controller in the computer 2 to the EDID memory 14. Accordingly, when the switch 16 is, for example, a MOS transistor, by using its power-supply voltage to control the gate of the MOS transistor, the MOS transistor is controlled to be switched on and off.

Next, the operation of the optical transmitter 1 having the above-described structure is described in association with the operation of the computer 2.

When the computer 2, as a signal generator, transmits the picture data to the display unit which is not shown, the DDC controller 23 requests a request to acquire the display information from the EDID memory 14 before performing transmission. Based on this request, the display information stored in the EDID memory 14 is read and is acquired by the DDC controller 23.

At this time, the power-supply voltage is supplied from the DDC controller 23 to the EDID memory 14 through the transmission cable 4, and this power-supply voltage sets the switch 16 to be in a state with its contact closed. Accordingly, power is supplied from the dedicated external power supply V1 to the receiver 11 and the laser driving circuit 12 through the power-supply line 15.

In addition, when the DDC controller 23 acquires the display information, as described above, the graphic controller 21 outputs, in parallel, to the driver 22, 8-bit RGB picture data stored in a memory (not shown), and outputs the display control signals to the driver 22.

The driver 22 converts the parallel picture data into a series form, and transmits the series picture data obtained by the conversion and display control signals thereof to the receiver 11 in the optical transmitter 1.

After receiving the picture data and the display control signals from the driver 22, the receiver 11 outputs them to the laser driving circuit 12. The laser driving circuit 12 controls the laser emitting devices of the light emitting unit 13 to perform emission in response to the picture data and the display control signals. This converts the electric signals into optical signals.

As described above, according to the first embodiment, when the computer 2 needs to transmit picture data, the switch 16 is turned on, so that power is supplied from the external power supply V1 to the laser driving circuit 12, etc. In addition, when data transmission is not necessary, the switch 16 is turned off, so that the power supply is stopped.

Therefore, according to the first embodiment, only when the computer 2 needs to transmit the picture data does it enable driving of the laser emitting devices of the light emitting unit 13 to perform emission. Thus, reduced power consumption can be achieved.

Also, according to the first embodiment, if the power is mistakenly supplied to the optical transmitter 1 when the optical cable 3 is set up, the laser emitting devices cannot operate to perform emission. Thus, the safety of an operator can be ensured in the operation of setting the optical cable 3.

In the first embodiment, the EDID memory 14 is provided in order to perform DDC communication, and the control of the switch 16 to open and close is performed in response to the level of the power-supply voltage supplied from the DDC controller 23 to the EDID memory 14.

However, when it is not necessary to change the display unit for the computer 2, DDC communication can also be omitted. In this case, the optical transmitter does not need to include the EDID memory 14. At this time, the power supply of the DDC controller is used only for the control of the switch 16.

In addition, in the first embodiment, a clock "Clock" is supplied from the DDC controller 23 to the EDID memory 14. The Clock is pulled up and set to be in "H" level before the controller 23 performs DDC communication, and is in "L" level after the communication starts.

Accordingly, by using the Clock, the contact of the switch 16 may be opened and closed. For example, when the switch 16 is a MOS transistor, by using an inverter to invert the Clock, and using the inverted output to control the gate of the transistor, the MOS transistor is controlled to be switched on and off.

In addition, similarly to the Clock, a data requesting signal on the data line can also be used as a control signal for the switch 16.

Next, a second embodiment of an optical transmitter of the present invention is described with reference to FIG. 2.

Figure 2:
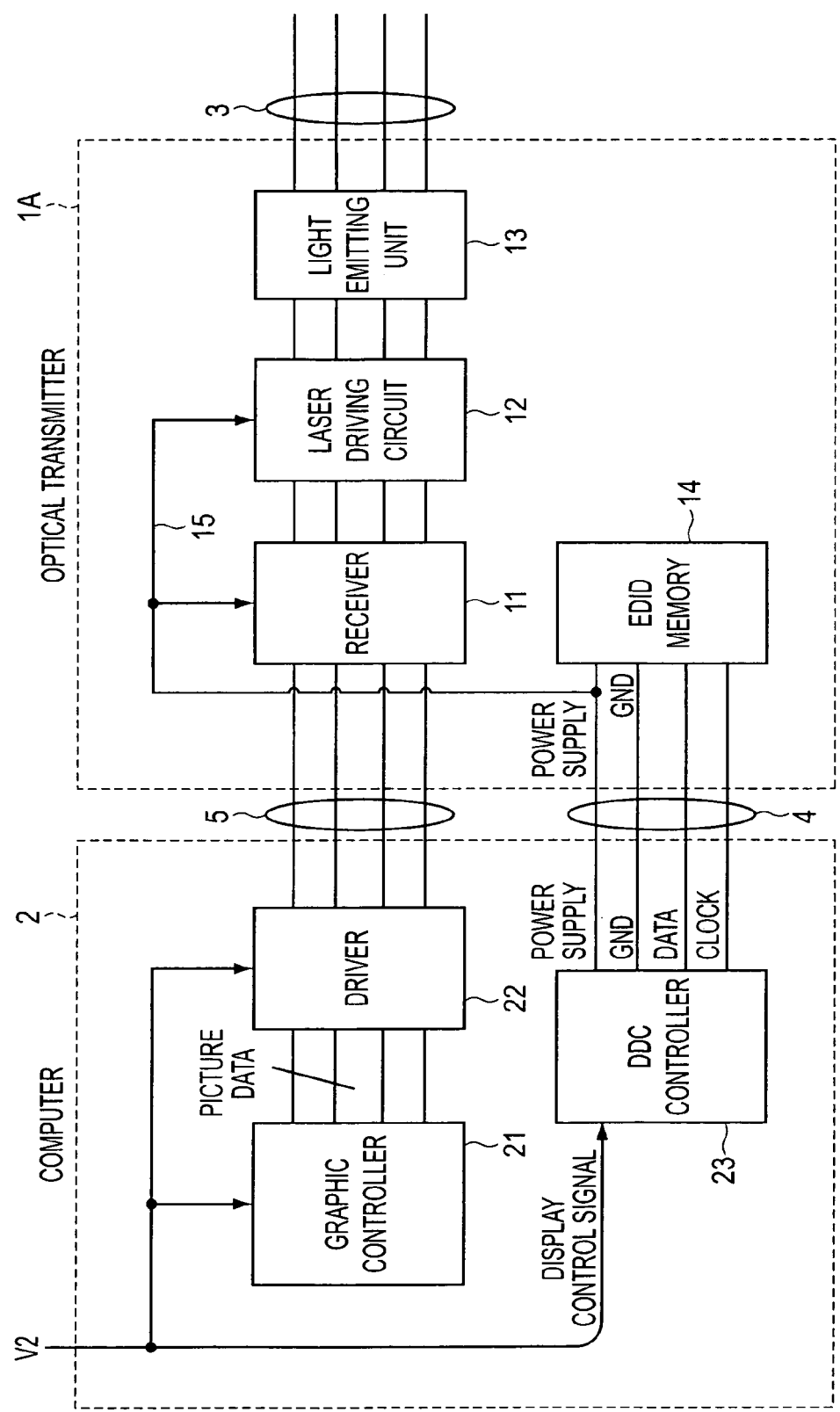
FIG. 2 is a schematic showing the structure of an optical transmitter according to a second embodiment of the present invention.

In an optical transmitter 1A according to the second embodiment, as shown in FIG. 2, the switch 16 shown in FIG. 1 is omitted, and the power-supply voltage supplied from the DDC controller 23 to the EDID memory 14 is also supplied to the receiver 11 and the laser driving circuit 12. Accordingly, in the optical transmitter 1A, the power-supply line of the transmission cable 4 is thickened and, the power-supply line and the power-supply line 15 are electrically connected to each other.

Since the structure of the other parts of the optical transmitter 1A according to the second embodiment and the structure of the computer 2 are similar to that of the optical transmitter 1 in FIG. 1 and that of the computer 2, a detailed description of identical elements is omitted by using identical reference numerals for the elements.

In the second embodiment having the above-described structure, the power-supply voltage is supplied from the controller 23 included in the computer 2 to the laser driving circuit 12, etc. Also, when data transmission is not necessary, the supply of a power-supply voltage thereof is stopped.

Accordingly, according to the second embodiment, only when the computer 2 needs to transmit picture data does it enable driving of the laser emitting devices in the light emitting unit 13 to perform emission. Thus, reduced power consumption can be achieved.

Next, a third embodiment of an optical transmitter of the present invention is described with reference to FIG. 3.

Figure 3:
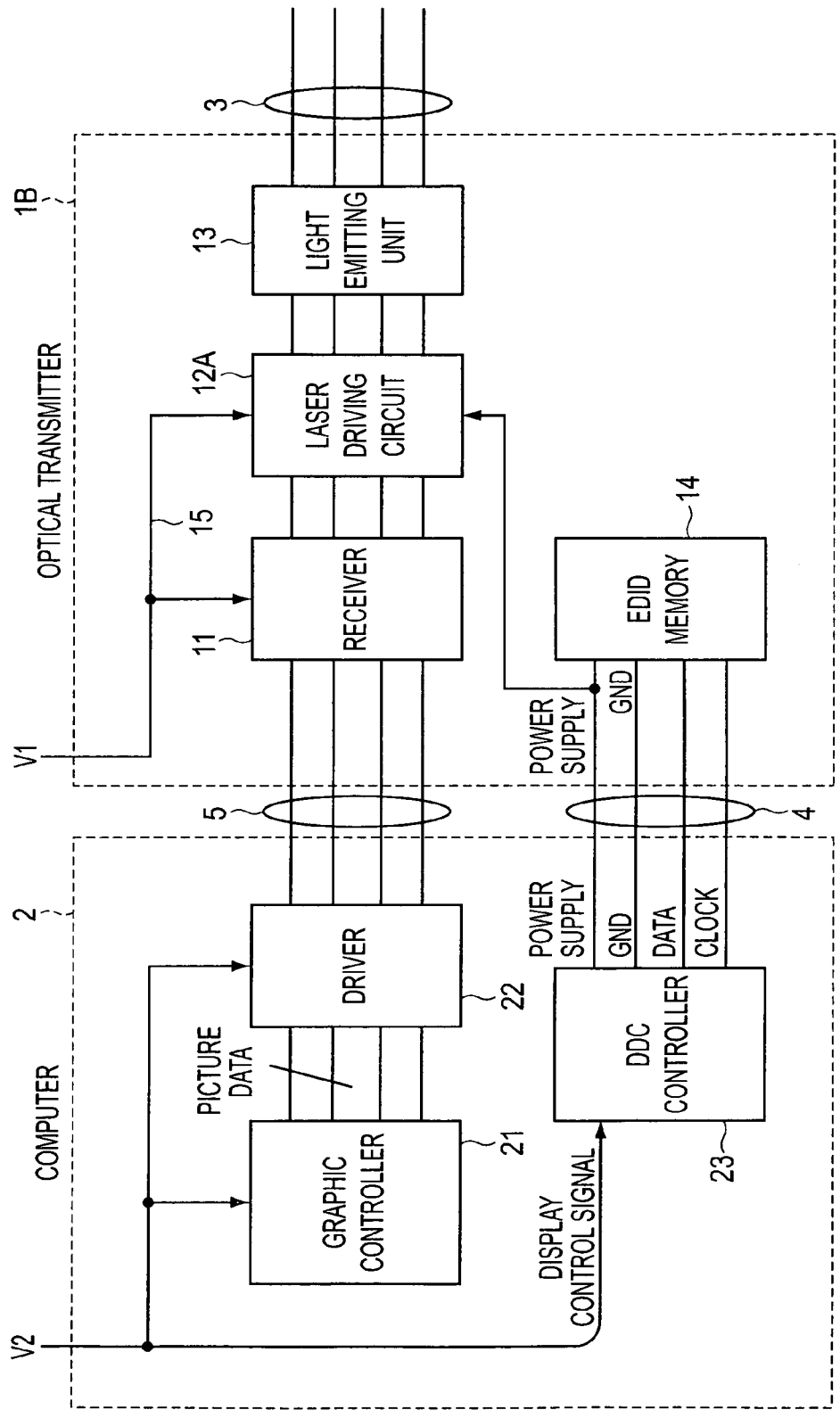
FIG. 3 is a schematic showing the structure of an optical transmitter according to a third embodiment of the present invention.

In an optical transmitter 1B according to the third embodiment, as shown in FIG. 3, the laser driving circuit 12 shown in FIG. 1 is replaced by a laser driving circuit 12A in which its operation can externally be controlled, and the operation control of the laser driving circuit 12A is performed based on a power-supply voltage supplied from the DDC controller 23 to the EDID memory 14.

Since the structure of the other parts of the optical transmitter 1B according to this embodiment and the structure of the computer 2 are similar to those of the optical transmitter 1 and computer 2 shown in FIG. 1, a detailed description of identical elements is omitted by using identical reference numerals for the elements. Accordingly, in the following, differences in the structures are mainly described.

A laser driving circuit 12A includes an enable terminal (not shown), and based on an enable signal externally supplied to the enable terminal, the light emitting operation or non-emitting operation of each light-emitting device in the light emitting unit 13 is controlled. In other words, the light-emitting operation mode of the laser emitting devices allows the bias current to flow, while the non-emitting operation mode stops the flow of the bias current.

In addition, the power-supply voltage supplied for the DDC controller 23 to the EDID memory 14, or the Clock or data "Data" supplied from the DDC controller 23 to the EDID memory 14 is used as the enable signal.

In the third embodiment having the above-described structure, when the computer 2 needs to transmit picture data, the power-supply voltage which is supplied to the enable terminal of the laser driving circuit 12 and which is supplied from the DDC controller 23 to the EDID memory 14 is in "H" level. Accordingly, based on the picture data from the computer 2, the laser driving circuit 12A operates each laser emitting device to perform emission.

In addition, when the data transmission is not necessary, the power-supply voltage supplied to the enable terminal is in "L" level. Accordingly, the laser driving circuit 12A operates to perform emission, and the supply of the bias current is stopped.

Therefore, according to the third embodiment, only when the computer 2 needs to transmit the picture data does it enable driving of the laser emitting devices of the light emitting unit 13 to perform emission. Thus, reduced power consumption can be achieved.

As described above, according to the present invention, only when a signal generator needs to transmit data does it enable driving of laser emitting devices to perform emission. Thus, reduced power consumption can be achieved.

What is claimed is:

1. An optical transmitter, comprising:
   a signal generator that provides an electric signal;
   laser emitting devices;
   a power supply for the signal generator;
   a laser driving circuit that receives the electric signal from the signal generator and that, based on the electric signal, drives the laser emitting devices;
   a dedicated power supply for the laser driving circuit, that is different from the power supply for said signal generator; and
   a switch between the dedicated power supply and the laser driving circuit that switches electric connection between the dedicated power supply and the laser driving circuit, the switching of said switch being performed based on a predetermined control signal from said signal generator,
   wherein when data transmission is not necessary, the switch is turned off and power supply to the laser driving circuit is stopped.

2. The optical transmitter as set forth in claim 1, further including a storage device which stores beforehand display information on a display unit that displays picture data from said signal generator, and from which the display information is read in response to a request from a controller for said signal generator,
   a power supply for said storage device being shared as a power supply for said controller, and the switching of said switch being performed based on any one of a power-supply voltage of said storage device, or a clock signal or a data signal from said controller.

3. An optical transmitter, comprising:
   a signal generator that provides an electric signal;
   laser emitting devices;
   a laser driving circuit that receives the electric signal from the signal generator and that, based on the electric signal, drives the laser emitting devices;
   a display unit that displays picture data from the signal generator;
   a controller;
   a storage device which stores beforehand display information on the display unit that displays picture data from said signal generator, and from which the display information is read in response to a request from the controller for said signal generator; and
   a power supply for said laser driving circuit and said storage device that also provides power for said controller,
   wherein when data transmission is not necessary, the controller stops power supply to the laser driving circuit.

4. An optical transmitter, comprising:
   a signal generator that provides an electric signal;
   laser emitting devices;
   a laser driving circuit that receives the electric signal from the signal generator and that, based on the electric signal, drives the laser emitting devices, based on an external enable signal, said laser driving circuit controls a light-emitting operation or non-light-emitting operation of said laser emitting devices,
   a power supply for the signal generator; and
   a dedicated power supply that is different from the power supply for said signal generator;
   wherein a predetermined control signal from said signal generator is used as said enable signal, and when data transmission is not necessary, the enable signal is turned off and power supply to the laser driving circuit is stopped.

5. The optical transmitter as set forth in claim 4, further including a storage device which stores beforehand display information on a display unit to display picture data from said signal generator, and from which the display information is read in response to a request from a controller for said signal generator,
   a power supply for said storage device being shared as a power supply for said controller, and said enable signal being set based on any one of a power-supply voltage of said storage device, or a clock signal or a data signal from said controller.

* * * * *